(12) United States Patent
Hill et al.

(10) Patent No.: US 10,620,245 B2
(45) Date of Patent: Apr. 14, 2020

(54) METHOD AND DEVICE FOR MONITORING A SUBMARINE CABLE

(71) Applicant: LIOS Technology GmbH, Cologne (DE)

(72) Inventors: Wieland Hill, Odenthal (DE); Peter Schaefer, Cologne (DE); Martin Olschewski, Grafschaft (DE)

(73) Assignee: NKT PHOTONICS GMBH, Cologne (DE)

( * ) Notice: Subject to any disclaimer, the term of this patent is extended or adjusted under 35 U.S.C. 154(b) by 462 days.

(21) Appl. No.: 15/092,118

(22) Filed: Apr. 6, 2016

(65) Prior Publication Data

US 2016/0298960 A1   Oct. 13, 2016

(30) Foreign Application Priority Data

Apr. 7, 2015  (DE) .................. 10 2015 105 241
Jun. 15, 2015 (DE) .................. 10 2015 109 493

(51) Int. Cl.
| | |
|---|---|
| *G01R 22/06* | (2006.01) |
| *G01B 21/18* | (2006.01) |
| *G01K 1/14* | (2006.01) |
| *G01K 11/32* | (2006.01) |
| *G01R 31/02* | (2006.01) |

(52) U.S. Cl.
CPC ............ *G01R 22/06* (2013.01); *G01B 21/18* (2013.01); *G01K 1/14* (2013.01); *G01K 11/32* (2013.01); *G01R 31/021* (2013.01)

(58) Field of Classification Search
CPC ........ G01B 21/08; G01N 25/18; G01R 22/06; G01R 31/021; G01K 1/14; G01K 11/32;
(Continued)

(56) References Cited

U.S. PATENT DOCUMENTS

| 4,372,693 A | 2/1983 | Lutz |
|---|---|---|
| 8,113,038 B2 | 2/2012 | Liang |

(Continued)

FOREIGN PATENT DOCUMENTS

| CN | 1625016 A | 6/2005 |
|---|---|---|
| CN | 101206189 A | 6/2008 |

(Continued)

OTHER PUBLICATIONS

Rasmus Olsen et al. : Modeling of Dynamic Transmission Cable Temperature Considering Soil-Specific Heat, Thermal Resistivity, and Precipitation, IEEE Transactions of Power Delivery, IEEE Service Center, New York, NY, US; vol. 28, No. 3, Jul. 1, 2013 (Jul. 1, 2013), pp. 1909-1917, XP011516048.

(Continued)

*Primary Examiner* — Mouloucoulaye Inoussa
(74) *Attorney, Agent, or Firm* — Cohen & Hildebrand, PLLC

(57) ABSTRACT

Device for monitoring a submarine cable (1) comprising at least one optical fiber (2) which is arranged in or on the submarine cable (1), at least one laser light source (3), the light of which can be coupled into the optical fiber (2), wherein portions of the light back-scattered in the optical fiber (2) can be coupled out from the optical fiber (2), detection and evaluation means (5) capable of detecting the back-scattered light and determining from the detected light spatially resolved the temperature of the optical fiber (2), detection means (6) for the electric current flowing in the submarine cable (1), evaluation means (7) capable of storing the time profile of the detected temperature and the time profile of the detected electric, wherein the evaluation means (7) are capable of calculating from the time profiles of the temperature and the electric current spatially resolved the thermal resistance of the soil surrounding the submarine (Continued)

cable (1) and inferring from the spatially resolved determined thermal resistance of the soil the cover height of the submarine cable (1).

17 Claims, 4 Drawing Sheets

(58) Field of Classification Search
CPC .... G01K 7/42; G01M 11/331; G01M 11/335; G01M 11/336; G01M 5/0025; G01M 5/0041; G01M 5/0091; G01M 11/086; G01J 3/45; G01L 3/12; G01L 5/105; G01L 1/242
USPC .......... 356/453, 73.1; 702/65; 374/E11.015, 374/E7.042, 161
See application file for complete search history.

(56) References Cited

U.S. PATENT DOCUMENTS

2005/0125174 A1* 6/2005 Nam .................. G01K 7/42
702/65

2013/0229662 A1* 9/2013 Ogawa .................. G01M 11/331
356/453

FOREIGN PATENT DOCUMENTS

| | | |
|---|---|---|
| CN | 102590275 A | 7/2012 |
| DE | o2203 | 4/1951 |
| DE | 3518909 | 11/1986 |
| DE | 4434618 | 4/1996 |
| DE | 69115773 | 6/1996 |
| DE | 102009043547 A1 | 3/2011 |
| EP | 0203249 A2 | 12/1986 |
| EP | 0825459 A2 | 9/2004 |
| JP | 2004264090 A | 9/2004 |
| WO | 2014056541 A1 | 4/2014 |

OTHER PUBLICATIONS

Heinrich Brakelmann, "Cable Connection with the Offshore wind farm Arcadis East 1. Thermal and Magnetic Emissions", Rheinberg, pp. 1-52 (2010). {Concise Explanation of Relevancy of This Foreign Publication is Provided on p. 9, Line 30 Through p. 11 Last Sentence of the Specification of the Present Application}.

* cited by examiner

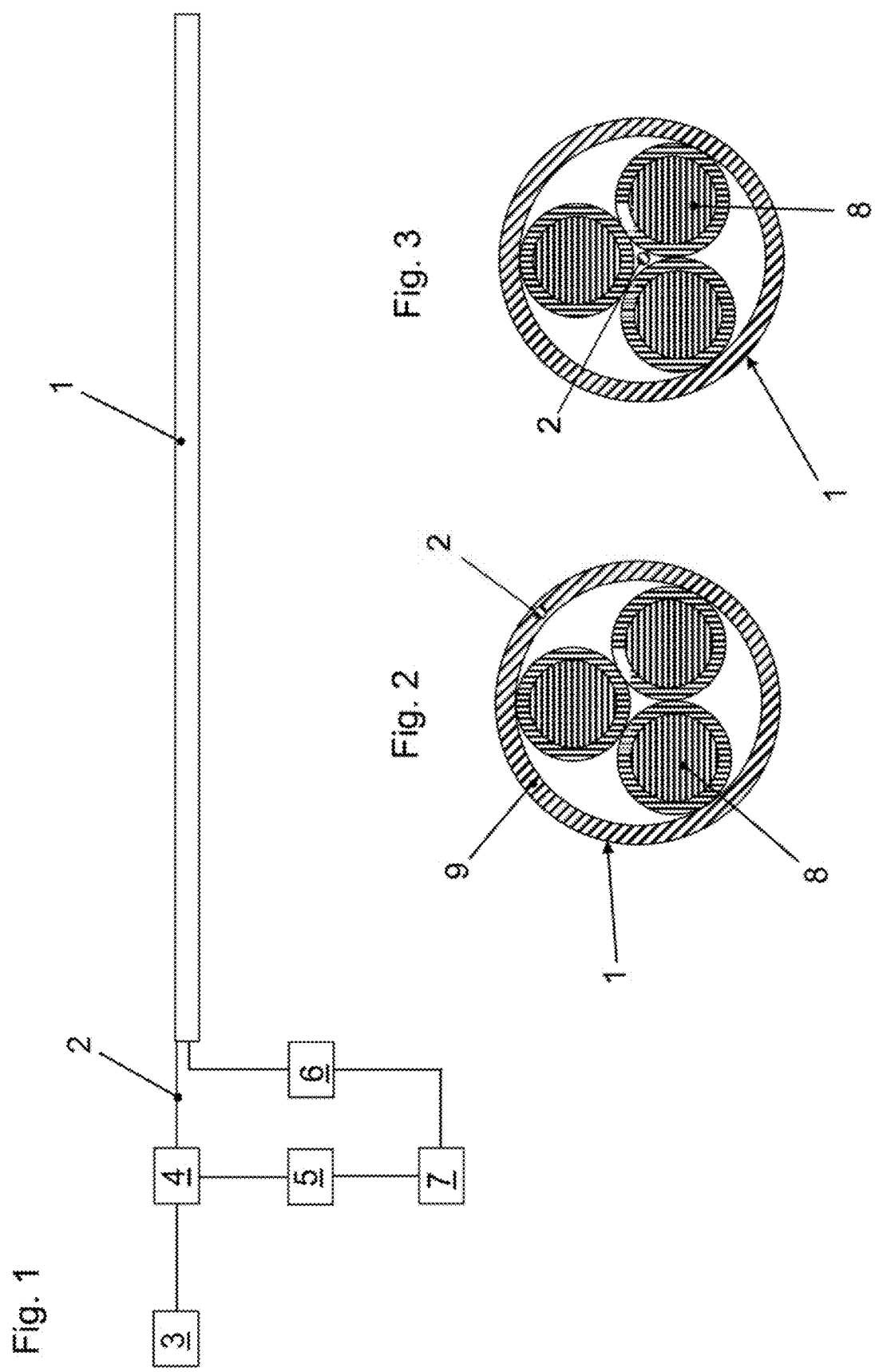

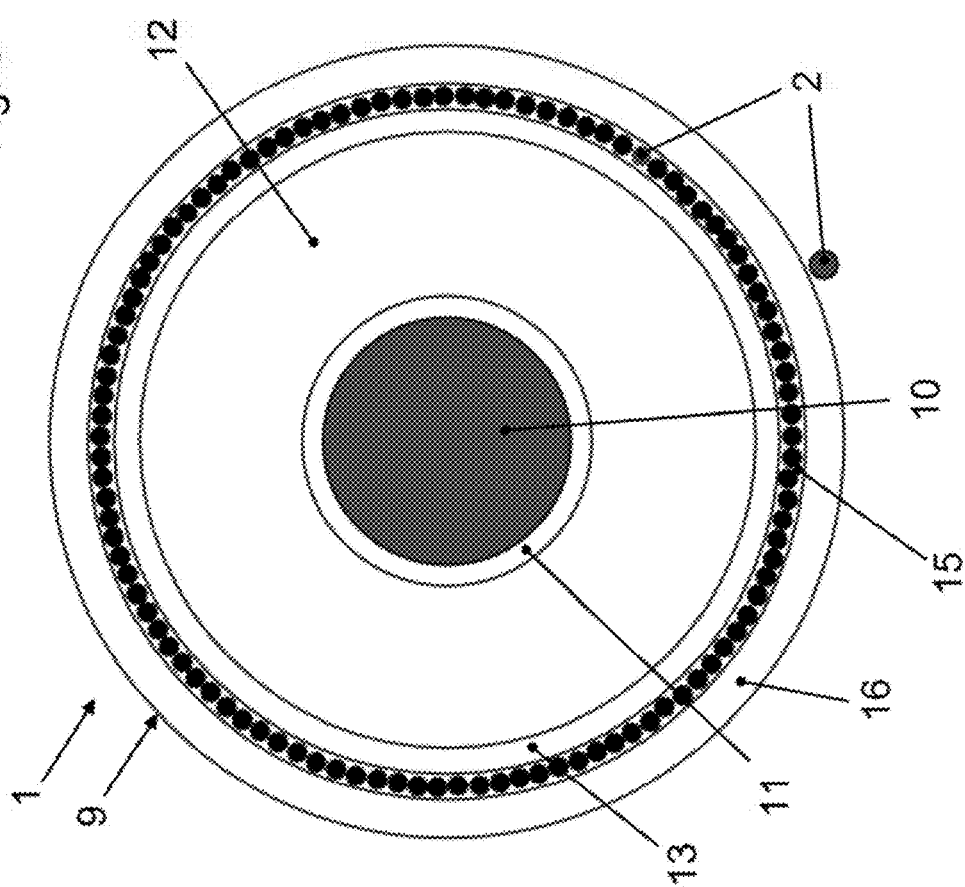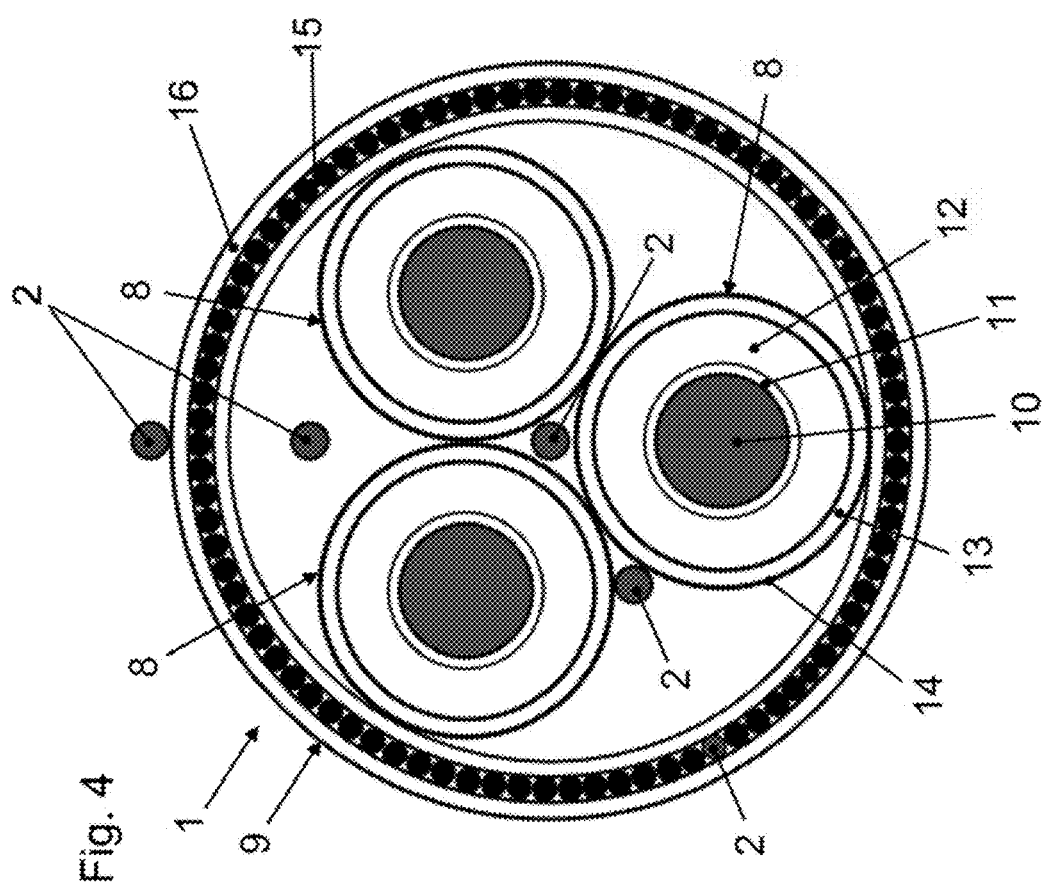

METHOD AND DEVICE FOR MONITORING A SUBMARINE CABLE

This is an application based on and claiming priority to DE 10 2015 105 241.5, filed on Apr. 7, 2015 and DE 10 2015 109 493.2, filed on Jun. 15, 2015, each of which is herein incorporated by reference in their entirety.

BACKGROUND OF THE INVENTION

The present invention relates to a method and a device for monitoring a submarine cable, which is used in particular to transport energy.

Definitions: In the present application, covered height of the submarine cable refers to the height of soil material arranged on top of the submarine cable, which is usually sand.

Submarine cables are increasingly being used to transport large quantities of energy of wind farms or between different countries. To secure the cable against dropped anchor and similar events, the submarine cable must typically be covered with a layer of sand having a particular statutory minimum layer thickness of sand, for example, in the order of 1.5 m. If the sand layer is completely missing, the cable can be moved by ocean currents and is thus also subjected to increased mechanical wear.

To date, no technical solutions are known for permanently monitoring the layer thickness of the sand above the submarine cable or when the sand above the submarine cables is flushed away. Therefore, inspections using diving robots and similar complex equipment must be performed in regular intervals.

The problem underlying the present invention is thus to provide a method and a device that enable reliable and cost-effective monitoring of the submarine cable.

BRIEF SUMMARY OF THE INVENTION

This is achieved according to the invention with a method having the features of claim 1 and with a device having the features of claim 9. The dependent claims relate to preferred embodiments of the invention.

According to claim 1, the method includes the following method steps:

The time profile of the temperature of the submarine cable is determined spatially resolved with a fiber optic system to obtain a distributed temperature measurement, The time profile of an electric current flowing through the submarine cable is determined, The thermal resistance of the soil surrounding the submarine cable is calculated spatially resolved from the determined time profiles of the temperature and the electric current, The covered height of the submarine cable is inferred from the spatially resolved calculated thermal resistance of the soil.

In this way, the complex solutions known from the prior art, such as the regular inspections with diving robots, can be dispensed with. For this purpose, the fiber-optic system may include, for example, an optical fiber mounted on or in the submarine cable which extends, in particular, over the entire length of the submarine cable. With the aid of the optical fiber, the fiber-optic system can determine spatially resolved the temperature of submarine cable. In particular, a change of the thermal resistance can be detected at a specific location of the submarine cable by continuously determining the temperature and the electric current flowing through the submarine cable, which in turn allows conclusions about a change in the cover of the submarine cable with sand at the corresponding location.

The time profile of the temperature and/or electric current is determined over a period of at least one hour, in particular at least one day, preferably several days, for example one week. Specifically, the thermal resistance of the soil surrounding the submarine can be determined relatively accurately when the electric current during this period, in which the time profile of the temperature and/or the electric current is determined, changes.

The thermal resistance of the soil may be calculated for a plurality of locations along the length of the submarine cable, in particular for more than half of the submerged length of the submarine cable, preferably for the entire submerged length of the submarine cable. The thermal resistance of the soil can hereby be calculated simultaneously for the plurality of locations along the submarine cable, wherein in particular the thermal resistance of the soil is continuously calculated. This allows a continuous and real-time determination of the thermal resistance of the soil surrounding the submarine cable along the entire submerged length of the submarine cable, thus enabling reliable monitoring of the cover of the submarine cable.

An algorithm may be used for evaluating of the determined time profiles of the temperature and the electric current which adapts as variable parameters the thermal resistance of the soil and the temperature of the environment of the submarine cable to the measured time profiles of the temperature and the electric current. Here, the fit of these environmental parameters in the thermal model can be used to continuously determine of the sand layer thickness along the submarine cable. In particular, the outer thermal resistance is a function of the sand layer thickness and can therefore be used for its determination.

The invention thus uses the approach of determining the height of the cover from the thermal resistance around the submarine cable. It has been explicitly shown that the locations with insufficient sand layer thickness are not always found where the lowest temperatures are measured, because low temperatures can also be caused by cold water currents and are thus not necessarily a sign for an inadequate sand layer thickness. Furthermore, when only the lowest temperatures are determined, a measure for the layer thickness, which would trigger maintenance measures, would still be lacking.

The fiber optic system for distributed temperature measurement may be based on Raman or Brillouin scattering. These represent widely used, proven measurement methods, which have high accuracy and reliability.

According to claim 9, the device for monitoring a submarine cable includes

At least one optical fiber for a spatially resolved temperature measurement, wherein the optical fiber is arranged or can be arranged in or on the submarine cable, At least one laser light source whose light can be coupled into the optical fiber, wherein portions of the light generated by the laser light source and back-scattered in the optical fiber can be coupled out of the optical fiber, Detection and evaluation means that detect the back-scattered light and are capable of determining from the detected back-scattered light spatially resolved the temperature of the optical fiber, Detection means for the electric current flowing in the submarine cable, Evaluation means capable of storing the time profile of the spatially resolved determined temperature and the time profile of the detected electric current, wherein the evaluation means are capable of calculating from the time profiles of the temperature and the electric current spatially resolved the thermal resistance of the soil surrounding the submarine cable and inferring from the spatially resolved determined thermal resistance of the soil to the covered height of the submarine cable.

With such a device, the cover of the submarine cable can be reliably monitored, wherein the device is particularly suited to carry out the method according to the invention.

Additional features and advantages of the present invention will become apparent from the following description of preferred exemplary embodiments with reference to the accompanying drawings, which show in:

BRIEF DESCRIPTION OF THE DRAWINGS

FIG. 1 schematically a device according to the invention;

FIG. 2 a cross-section through a schematically illustrated first submarine cable with a first example of an installation of an optical fiber in the submarine cable;

FIG. 3 a cross-section through the schematically shown first submarine cable with a second example of an installation of an optical fiber in the submarine cable;

FIG. 4 a cross-section through a schematically illustrated second submarine cable with several examples of an installation of an optical fiber in the submarine cable;

FIG. 5 a cross-section through a schematically illustrated third submarine cable with several examples of an installation of an optical fiber in the submarine cable;

DETAILED DESCRIPTION OF THE INVENTION

Figure 6:
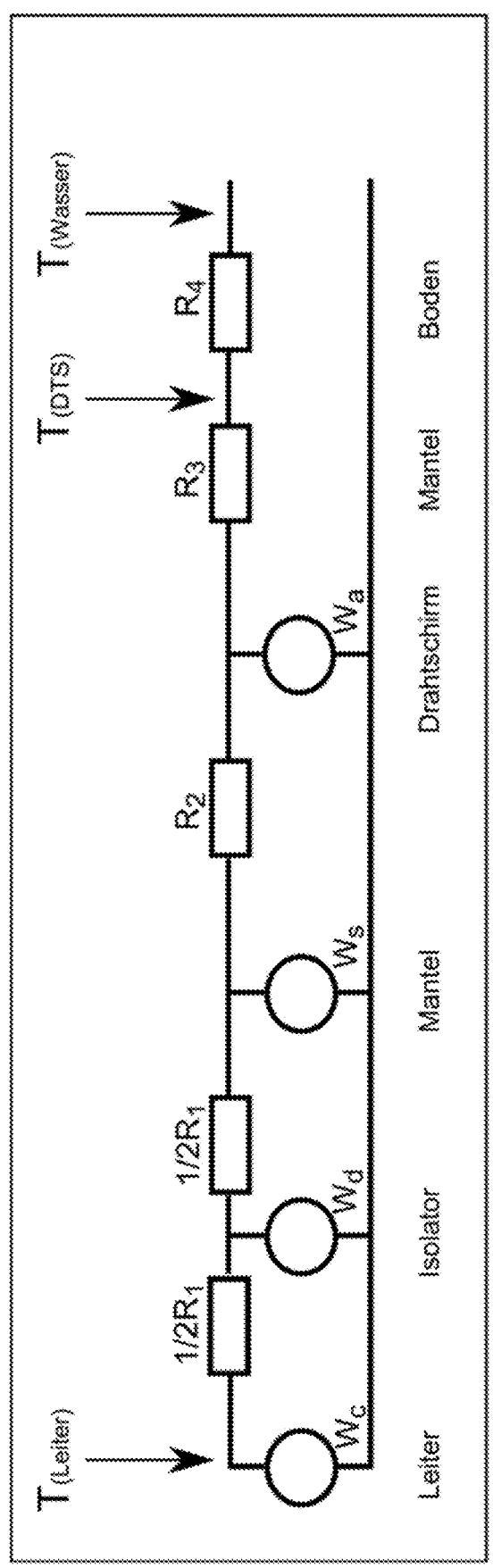
FIG. 6 a thermal equivalent circuit diagram for an installed submarine cable.

In the figures, identical or functionally identical parts are provided with identical reference numerals.

Submarine cables can be constructed in different ways. Submarine cables for transmitting AC currents contain all three phases together. The optical fibers for linear temperature measurement along the submarine cable can have different fiber positions.

In addition to the position in the center of the submarine cable between the individual phases, laterally offset positions in direct contact with two of the three phases, as well as in the fill material of the submarine cable are also feasible. Furthermore, the optical fiber can also be located in the wire shield or in direct contact with the outer sheath of the submarine cable.

Alternatively, three individual submarine cables may also be installed, wherein each individual submarine cable has one respective electrical conductor. However, this is not implemented in practical applications due to the significantly greater complexity of the installation. In the case of DC transmission, two single-phase submarine cables are normally used. The optical fiber serving as the temperature sensor is here typically located in the wire shield, or in direct contact with the outer sheath.

In addition to a direct installation on the seabed, submarine cables may also be installed inside an additional pipe (for example, made of HDPE or concrete). This enclosure is installed in particular in areas of a transition from sea to land, and vice versa, or in areas of shallow water depth. The detailed description regarding dimensions and materials can be stored in software used by the method according to the invention, wherein the algorithm is capable of performing an analysis of the surroundings outside the enclosure.

FIG. 1 shows schematically a submarine cable 1 which extends beyond the end shown at the right side of FIG. 1, in particular beyond several kilometers. The submarine cable 1 is to be used to transport energy, so that strong electric currents will flow in the submarine cable 1. An optical fiber 2 is arranged in the submarine cable 1, which extends in particular over the entire length of the submarine cable 1 installed below seabed.

FIG. 2 and FIG. 3 show two exemplary arrangements of the optical fiber 2 in the submarine cable 1. Several cables 8, which are surrounded by a common cable shield 9, are shown in the schematically depicted submarine cable 1. In the first example depicted in FIG. 2, the optical fiber 2 runs in the cable shield 9. In the second example depicted in FIG. 3, the optical fiber 2 runs in the gusset of the cable 8.

FIG. 4 shows an example of a submarine cable 1 in a less schematic view. This submarine cable 1 has three phases and is used for AC transmission. Three individual cables 8 are arranged in the submarine cable 1, each cable 8 having a central conductor 10 for one of the three phases. The center conductor 10 is surrounded by an inner conductive layer 11, an insulation 12, an outer conductive layer 13 and a metallic shield 14.

When using the three cables 8 for the three phases of AC current, the inner and the outer conductive layers 11, 13 need not be used for the transmission of electric current, although one of the conductive layers 11, 13 can serve as the neutral conductor. However, this is not required. Furthermore, each of the metallic shields may be connected to ground potential.

The three cables 8 are together surrounded by a wire screen 15 serving as reinforcement which is in turn surrounded by an outer sheath 16. The wire screen 15 serving as reinforcement and the outer sheath 16 together form to the cable sheath 9.

FIG. 4 also shows various alternative arrangements of the optical fiber 2 in the submarine cable 1. As in FIG. 3, the optical fiber 2 may be arranged in the gusset 8 the cables 8. Furthermore, the optical fiber 2 may be disposed at other locations of the interior space of the submarine cable 1. The optical fiber 2 may also be arranged, in analogy to FIG. 2, in the cable shield 9 and in particular in the wire screen 15 which serves as a reinforcement. The optical fiber 2 may also be arranged outside and in direct contact with the outer sheath 16.

FIG. 5 also shows an example of a submarine cable 1 in a less schematic view. This submarine cable 1 has only a single phase and is used for a DC transmission. A single cable 8 having a center conductor 10 for one phase is arranged in the submarine cable 1. The center conductor 10 is surrounded by an inner conductive layer 11 an insulation 12, an outer conductive layer 13, a wire screen 15 serving as reinforcement and an outer sheath 16. The wire screen 15 serving as reinforcement together with the outer sheath 16 form the cable shield 9.

FIG. 5 also shows various alternative arrangements of the optical fiber 2 in the submarine cable 1. Like in FIG. 2, the optical fiber 2 may be arranged in the cable shield 9 and in particular in the wire screen 15 serving as reinforcement. The optical fiber 2 may also be arranged outside and in direct contact with the outer sheath 16.

The light of a laser light source 3 can be coupled into the optical fiber 2 by using suitable coupling means 4. Individual portions of the light can be back-scattered in the optical fiber 2 by way of temperature-dependent Raman or Brillouin scattering (see FIG. 1). The back-scattered portions can be supplied by the coupling means 4 to detection and evaluation means 5 which capture the scattered light and determine from the detected back-scattered light spatially resolved the temperature of the optical fiber 2. The fiber-optic system for distributed temperature measurement composed of the optical fiber 2, the laser light source 3 the coupling means 4 and the detection and evaluation means 5 is known in the art.

The temperature of the optical fiber 2 is thus determined by the detection and evaluation means 5, in particular simultaneously and continuously, at any location of the optical fiber 2, and hence at each location of the submarine cable 1.

FIG. 1 also shows schematically detection means 6 for the electric current flowing in the submarine cable 1. Any type of customary current measuring devices can be used as detection means 6.

The device further includes evaluation means 7 connected to the detection means 6 and the detection and evaluation means 5. The evaluation means 7 can store the time profile of the spatially resolved determined temperature and the time profile of the detected electric current.

Furthermore, the evaluation means 7 are capable of calculating the spatially resolved thermal resistance of the soil surrounding the submarine from the time profiles of the temperature and the electric current. This is achieved by determining with a suitable algorithm the thermal resistance and the ambient temperature of the submarine cable 1 as variable parameters in the adaptation of a suitable thermal model to the time profiles of temperature and electric current. The time profiles used herein may span, for example, a period of one week.

It is essential when using such a method that the electric current changes during the particular period. Optionally, a change of the electric current over time may be predefined to make the determination of the thermal resistance reliable.

The employed algorithm takes into account that external parameters, such as in particular the thermal resistance of the soil and the ambient temperature, are subject to seasonal fluctuations.

The method according to the invention enables the use of the fiber optic system for distributed temperature measurement and described calculation methods for the continuous and simultaneous determination of the thermal resistance at any location of the submarine cable.

The evaluation means 7 can infer from the spatially resolved determined thermal resistance of the soil the covered height at each location of the submarine cable 1. To this end, data are stored in the evaluation means 7 or in the storage means associated with the evaluation means 7 which reflect the dependence of the thermal resistance around a submarine cable 1 on the layer thickness of a cover on the submarine cable 1.

The evaluation means 7 can determine, in particular continuously and simultaneously, the thickness of the cover at any location of the submarine cable 1

The evaluation means 7 can indicate to the user and/or trigger corresponding service responses when the evaluation means 7 determine that a part of the submarine cable 1 is no longer adequately covered with sand.

The temperature distribution and the time profile during cyclic load behavior in submarine cable 1 can be calculated with the equivalent circuit diagram shown in FIG. 6. Heat sources to be considered are here current sources $W_i$, thermal resistances as electric resistances $R_i$ and heat capacities as capacities (neglected here). Various thermal losses operate in a power cable, depending on whether it is operated with DC or AC current. Dielectric losses are generated in the insulator and eddy currents are generated in the metallic wire shield. Depending on the load condition and the operation of the cable, these losses contribute to different degrees to the heating of the power cable.

The temperature distribution from the electrical conductor (hot) to the environment (cold) is hence viewed like the drop of a voltage across a resistor and thus produces the temperature in the respective cable layer. The diagram was augmented with software used by the method according to the invention for the environment that is designated as soil or $R_4$, respectively. The temperature of the optical fiber 2 is designated with $T_{(DTS)}$.

Whether the submarine is still covered and with how much protective material, is determined with an algorithm based on $T_{(DTS)}$ for a corresponding load behavior of the electric current. As a result, the ambient temperature $T_{(water)}$ and the thermal resistance of the seabed $R_4$ are obtained.

With increasing installation depth, the temperature difference at equilibrium ("steady state") between the measured temperature of the DTS system (distributed feedback) or the temperature measured by the optical fiber 2, for example, between the optical fiber 2 at the outer shield of the cable and the water temperature, increases due to the thermal resistance of the soil.

Figure 7:
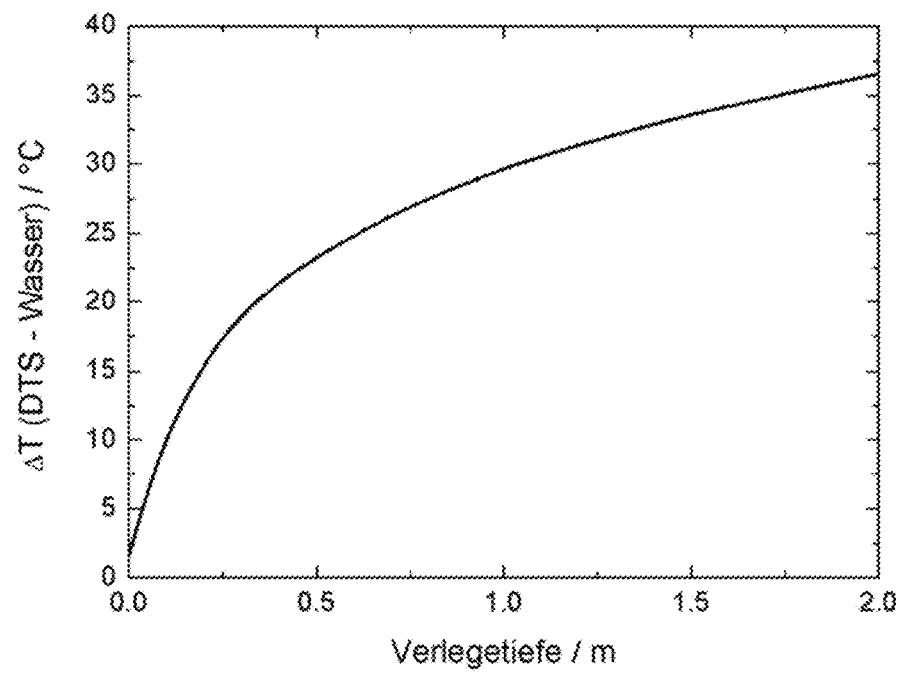
FIG. 7 a diagram showing a plot of the temperature difference ΔT between the optical fiber and the water temperature as a function of the installation depth of the submarine cable.

FIG. 7 shows an exemplary dependence of the temperature difference between the temperature of the optical fiber 2, on the one hand, and the water, on the other hand, on the installation depth of the submarine cable 1 or on the layer thickness of the cover of the submarine cable 1. If the temperature of the outer shield on which, for example, the optical fiber 2 is arranged is approximately equal to the water temperature in the equilibrium state, then the temperature of the outer shield is already well above the ambient temperature for an installation depth of 2 m.

Figure 8:
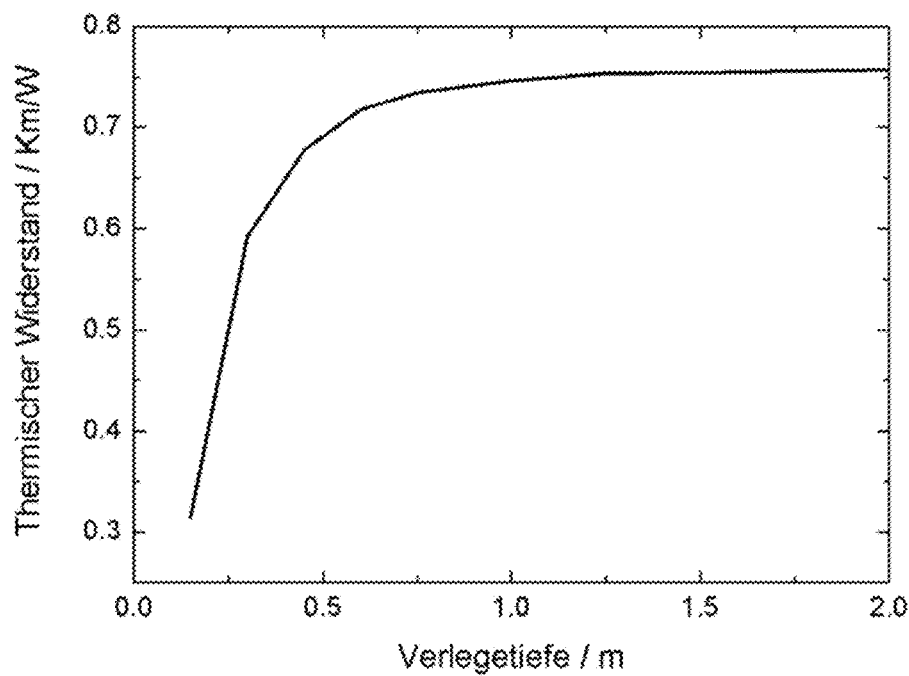
FIG. 8 a diagram showing a plot of the thermal resistance between the submarine cable and the surrounding water as a function of the installation depth of the submarine cable.

The employed algorithm solves the full equivalent circuit diagram schematically illustrated in FIG. 6 by using an up to seven-day history for the ambient parameters ambient temperature $T_{(water)}$ and thermal resistance of the seabed $R_4$ for a fit that optimizes both parameters based on a least-square fit. Initial values for the fit are optionally also obtained from additional sensors. The planned installation depth of the power cable in the seabed is stored in the software. When the submarine cable 1 is increasingly exposed, for example, due to ocean currents, the changed environment of the submarine cable 1 also changes the transient temperature behavior. The algorithm attributes this to an increasingly lower thermal resistance of the soil. As seen from FIG. 8, this effect is particularly pronounced before the submarine cable 1 is exposed in the ocean. A steady decrease of the installation depth can then also be observed.

This analysis can be performed in regular time- and location-dependent intervals, thus performing an analysis of the installation depth of the entire submarine cable 1.

Sea beds can be composed of different materials and can thus have different thermal properties. Table 1 lists various types and describes the possible range of thermal conductivity or specific thermal resistivity. The table is taken from the publication "Cable connections within the offshore wind farm Arcadis East 1. Thermal and magnetic emissions" by Heinrich Brakelmann, Rheinberg, 2010.

Since submarine cables typically have a length of 50 km and more, the submarine cable can be surrounded by different types of sea beds. In principle, the employed algorithm is able to determine the installation depth for different types of sea beds. Additional information (geological reports, results from sand samples, and the like) and a specific association of this information with different sea beds along the cable make it possible to achieve maximum accuracy.

TABLE 1

Thermal properties of water-saturated soil

| | Thermal conductivity minimum W/(K m) | Thermal conductivity maximum W/(K m) | Specific thermal resistance maximum K m/W | Specific thermal resistance minimal K m/W |
|---|---|---|---|---|
| Gravel | 2.00 | 3.30 | 0.50 | 0.30 |
| Sand (moisture dependent) | 1.50 | 2.50 | 0.67 | 0.40 |
| Clay | 0.90 | 1.80 | 1.11 | 0.56 |
| Boulder clay/ Glacial drift | 2.60 | 3.10 | 0.38 | 0.32 |
| Silt/sludge | 1.40 | 2.00 | 0.71 | 0.50 |

The invention claimed is:

1. A method for monitoring a submarine cable (1) using a fiber optic system for distributed temperature measurement including: (i) at least one optical fiber (2) for a spatially resolved temperature measurement, wherein the optical fiber is arranged in or on the submarine cable (1); (ii) at least one laser light source (3) producing light which is coupled into the optical fiber (2), wherein portions of the light generated by the laser light source (3) and back-scattered in the optical fiber (2) is coupled out from the optical fiber (2); (iii) detector and evaluation apparatus (5) that detects the back-scattered light and determines from the detected back-scattered light the spatially-resolved temperature measurement of the optical fiber (2); (iv) detector (6) for detecting electric current flowing in the submarine cable (1); and (v) evaluation device (7) for storing time profile of the determined spatially-resolved temperature and the time profile of the detected electric current, wherein the evaluation device (7) calculates from the time profiles of the determined spatially-resolved temperature and the detected electric current spatially-resolved thermal resistance of soil surrounding the submarine cable (1) and infers a covered height of the submarine cable (1) from the spatially-resolved thermal resistance of the soil; wherein the covered height of the submarine cable is a height of soil material arranged on top of the submarine cable, comprising the steps of:
determining using the evaluation device (7) the time profile of the spatially-resolved temperature measurement of the submarine cable (1),
determining using the evaluation device (7) the time profile of the detected electric current flowing through the submarine cable (1),
calculating using the evaluation device (7) a spatially-resolved thermal resistance of the soil surrounding the submarine cable (1) from the determined time profiles of the spatially-resolved temperature measurement and the detected electric current,
inferring using the evaluation device (7) the covered height of the submarine cable (1) from the calculated spatially resolved thermal resistance of the soil.

2. The method according to claim 1, further comprising the step of:
determining the time profile of the spatially-resolved temperature measurement and/or the detected electric current over a period of at least one hour.

3. The method according to claim 1, wherein the electric current changes during a time period, during which the time profile of the spatially-resolved temperature measurement and/or the detected electric current is determined.

4. The method according to claim 1, wherein the spatially-resolved thermal resistance of the soil is calculated for a plurality of locations along the submarine cable (1).

5. The method according to claim 4, wherein the spatially-resolved thermal resistance of the soil is calculated simultaneously for the plurality of locations along the submarine cable (1).

6. The method according to claim 1, wherein the spatially-resolved thermal resistance of the soil is continuously calculated.

7. The method according to claim 1, comprising the step of:
utilizing an algorithm for the evaluation of the detected time profiles of the spatially-resolved temperature measurement and the detected electric current, which adapts as variable parameters the spatially-resolved thermal resistance of the soil and temperature of the environment of the submarine cable (1) to the measured time profiles of the spatially-resolved temperature measurement and the detected electric current.

8. The method according to claim 1, wherein the fiber optic system for distributed temperature measurement is based on Raman- or Brillouin-scattering.

9. A fiber optic system for distributed temperature measurement for monitoring a submarine cable (1), the system comprising:
at least one optical fiber (2) for a spatially resolved temperature measurement, wherein the optical fiber is arranged in or on the submarine cable (1),
at least one laser light source (3), the light of which is coupled into the optical fiber (2), wherein portions of the light generated by the laser light source (3) and back-scattered in the optical fiber (2) is coupled out from the optical fiber (2),
detector and evaluation apparatus (5) that detect the back-scattered light and determine from the detected back-scattered light the spatially resolved temperature measurement of the optical fiber (2),
detector (6) for detecting electric current flowing in the submarine cable (1),
evaluation device (7) for storing time profile of the determined spatially-resolved temperature measurement and the time profile of the detected electric current, wherein the evaluation device (7) calculates from the time profiles of the spatially-resolved temperature measurement and the detected electric current spatially resolved thermal resistance of soil surrounding the submarine cable (1) and infers a covered height of the submarine cable (1) from the determined spatially resolved thermal resistance of the soil; wherein the covered height of the submarine cable is a height of soil material arranged on top of the submarine cable.

10. The system according to claim 9, wherein the system is suitable to execute the method according to claim 1.

11. The method according to claim 1, wherein the submarine cable is transporting energy.

12. The system for monitoring the submarine cable (1) according to claim 9, wherein the submarine cable is transporting energy.

13. The method according to claim 2, wherein the time profile of the spatially-resolved temperature measurement and/or the detected electric current is determined over a period of at least one day.

14. The method according to claim 2, wherein the time profile of the spatially-resolved temperature measurement and/or the detected electric current is determined over a period of several days.

15. The method according to claim 2, wherein the time profile of the spatially-resolved temperature measurement and/or the detected electric current is determined over a period of one week.

16. The method according to claim 4, wherein the spatially-resolved thermal resistance of the soil is calculated for more than half of a length of the submarine cable (1) installed under water.

17. The method according to claim 4, wherein the spatially-resolved thermal resistance of the soil is calculated for an entire length of the submarine cable (1) installed under water.

* * * * *